United States Patent [19]
Magaña

[11] Patent Number: 6,104,217
[45] Date of Patent: Aug. 15, 2000

[54] POWER ON/OFF CONTROL CIRCUIT AND METHOD

[75] Inventor: Javier V. Magaña, Austin, Tex.

[73] Assignee: Advanced Micro Devices, Inc., Sunnyvale, Calif.

[21] Appl. No.: 08/822,975

[22] Filed: Mar. 21, 1997

Related U.S. Application Data

[63] Continuation of application No. 08/621,769, Mar. 22, 1996, abandoned, which is a continuation of application No. 08/280,610, Aug. 26, 1994, abandoned.

[51] Int. Cl.[7] .................................................. H03K 3/00
[52] U.S. Cl. .......................................... 327/111; 327/339
[58] Field of Search .................................... 327/103, 111, 327/144, 221, 337, 339, 405, 589, 519, 52, 56, 72, 336, 77, 78

[56] References Cited

U.S. PATENT DOCUMENTS

| | | | |
|---|---|---|---|
| 3,365,586 | 1/1968 | Billings | 327/77 |
| 3,553,500 | 1/1971 | Easter | 327/77 |
| 3,582,679 | 6/1971 | Carp | 327/77 |
| 4,008,398 | 2/1977 | Schramm et al. | 327/77 |
| 4,245,192 | 1/1981 | Whiffen | 327/336 |

*Primary Examiner*—Jung Ho Kim

[57] ABSTRACT

An apparatus for turning power to a device on and off is disclosed. The apparatus comprises a first signal input, a second signal input, a first charge output electrically connected with the first signal input, a transistor electrically connected with the second signal input, and a second charge output electrically connected with the transistor. The first charge output, when the first signal input and second signal input are powered on, electrically ramps up a first portion of the device. This ramp up of the first portion draws from current available to ramp up a second portion of the device. The second charge output is, thus, provided. The second charge output, when the first signal input and second signal input are powered on, electrically charges the transistor and the transistor electrically ramps up the second portion of the device concurrently with the ramp up of the first portion.

7 Claims, 5 Drawing Sheets

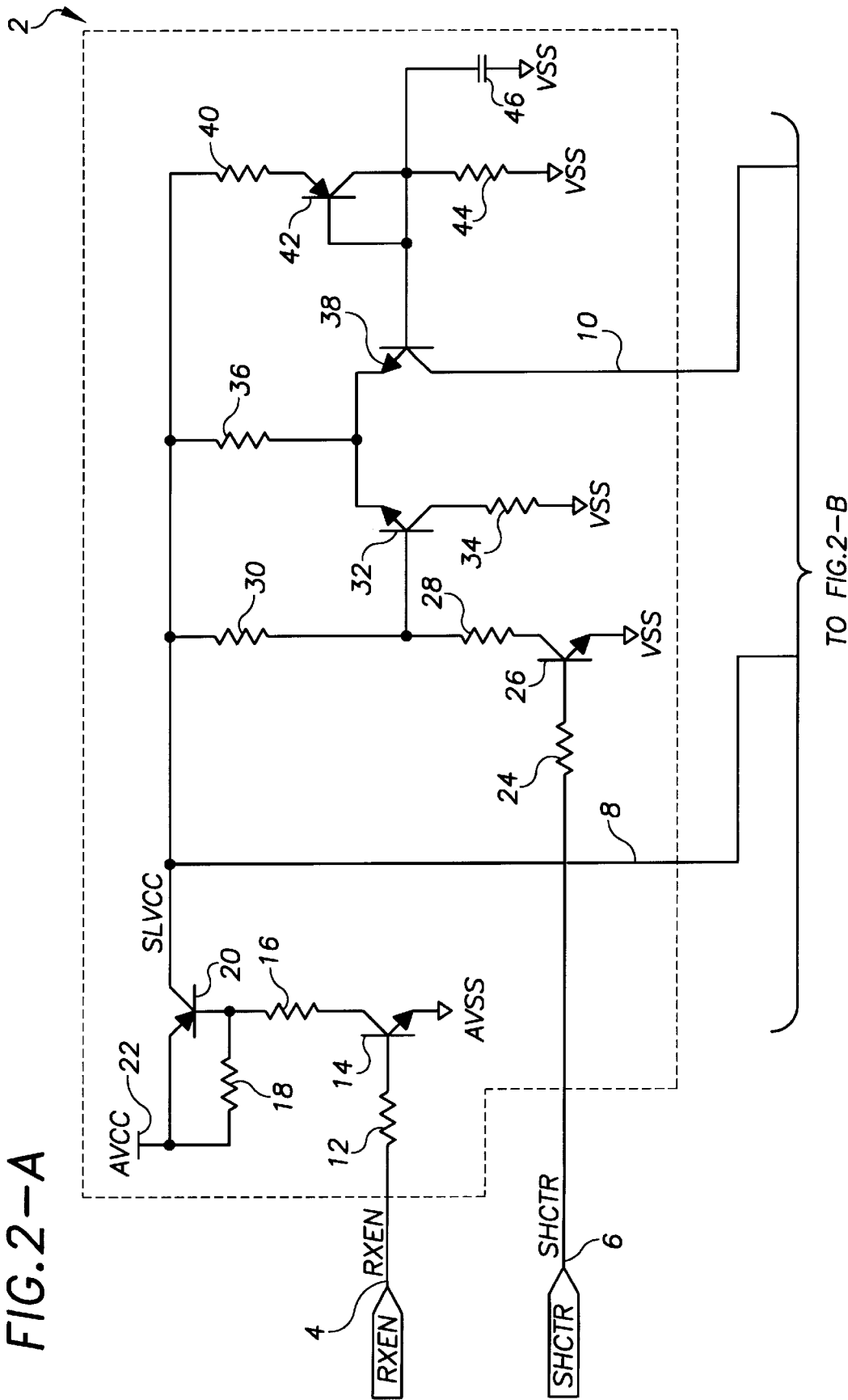
FIG.2-A

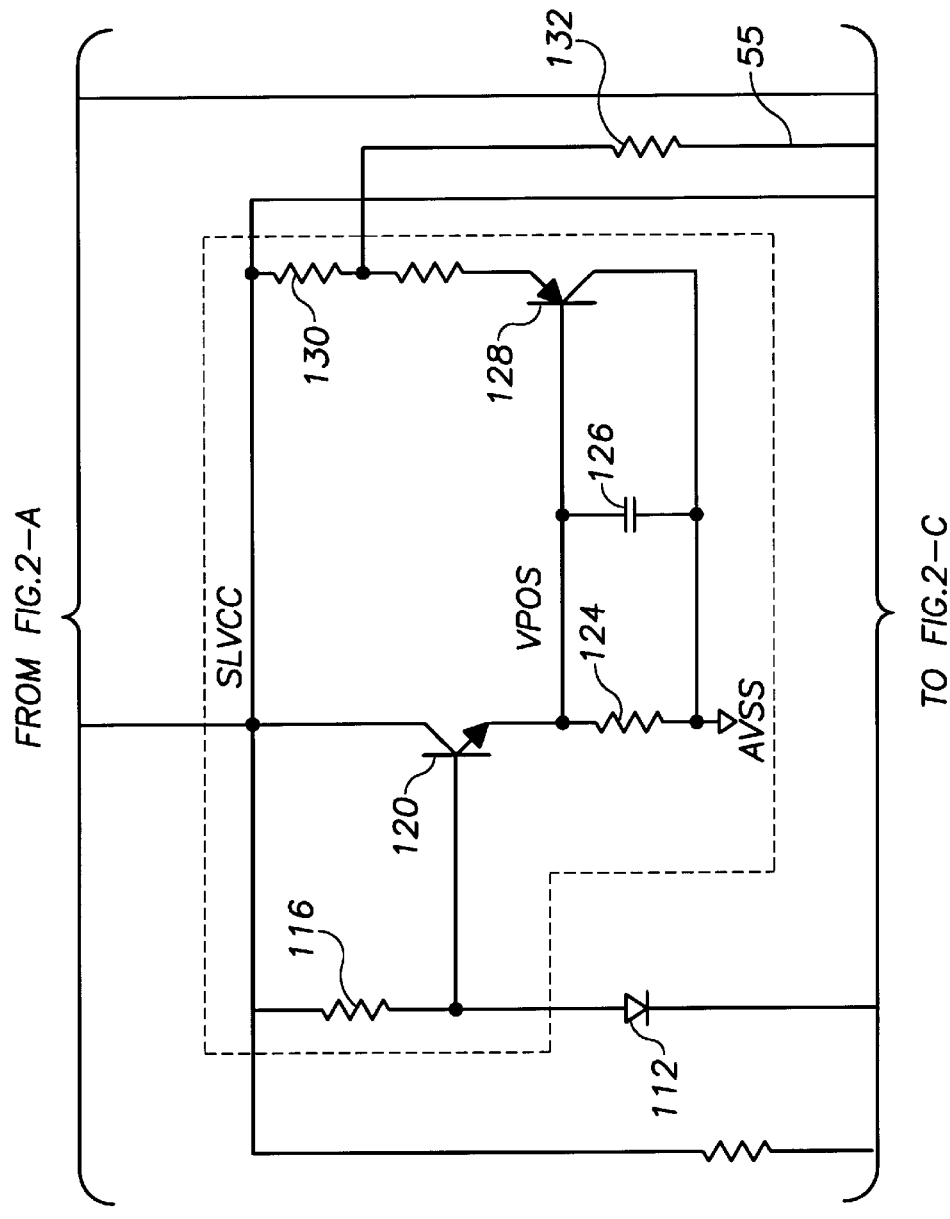
FIG.2-B

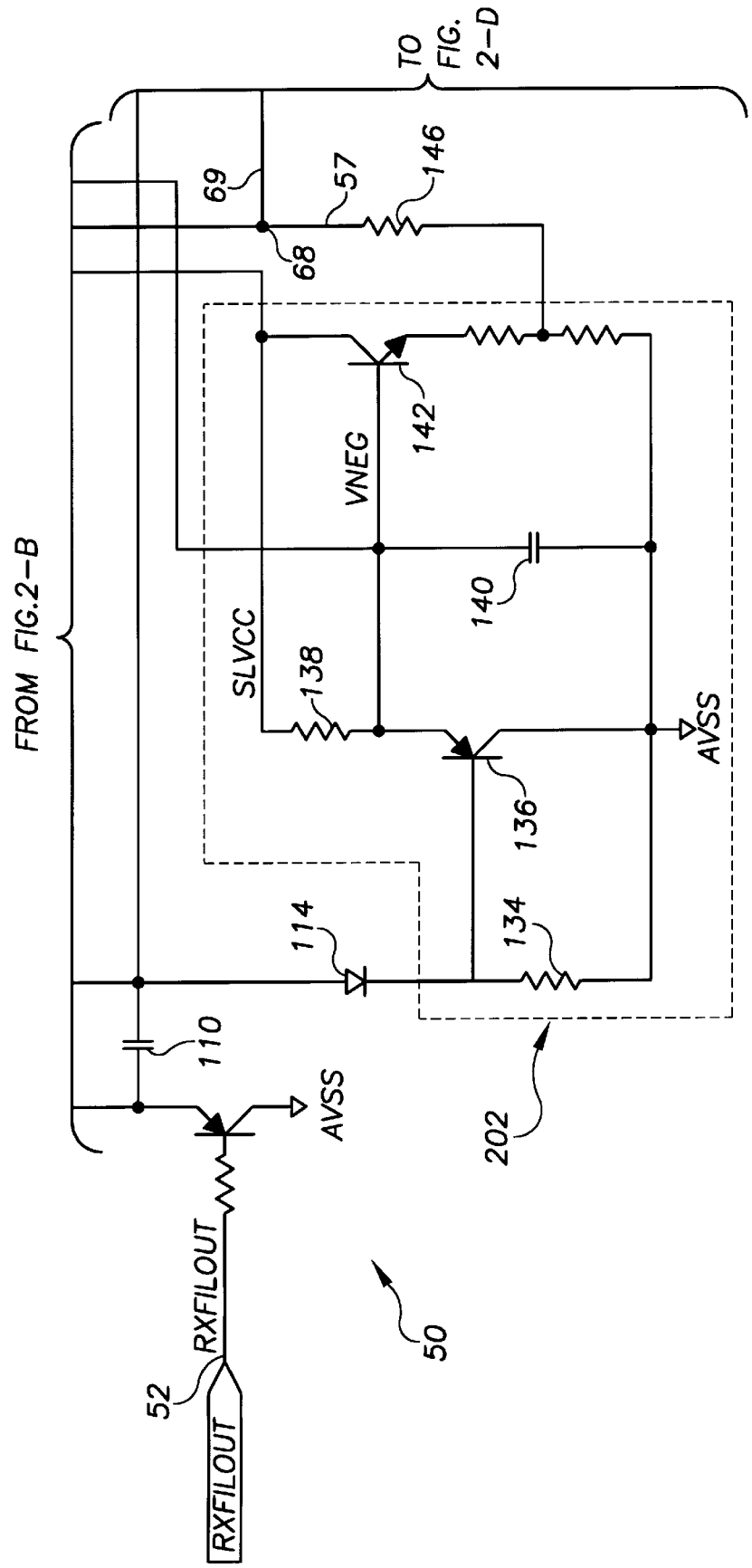
FIG.2-C

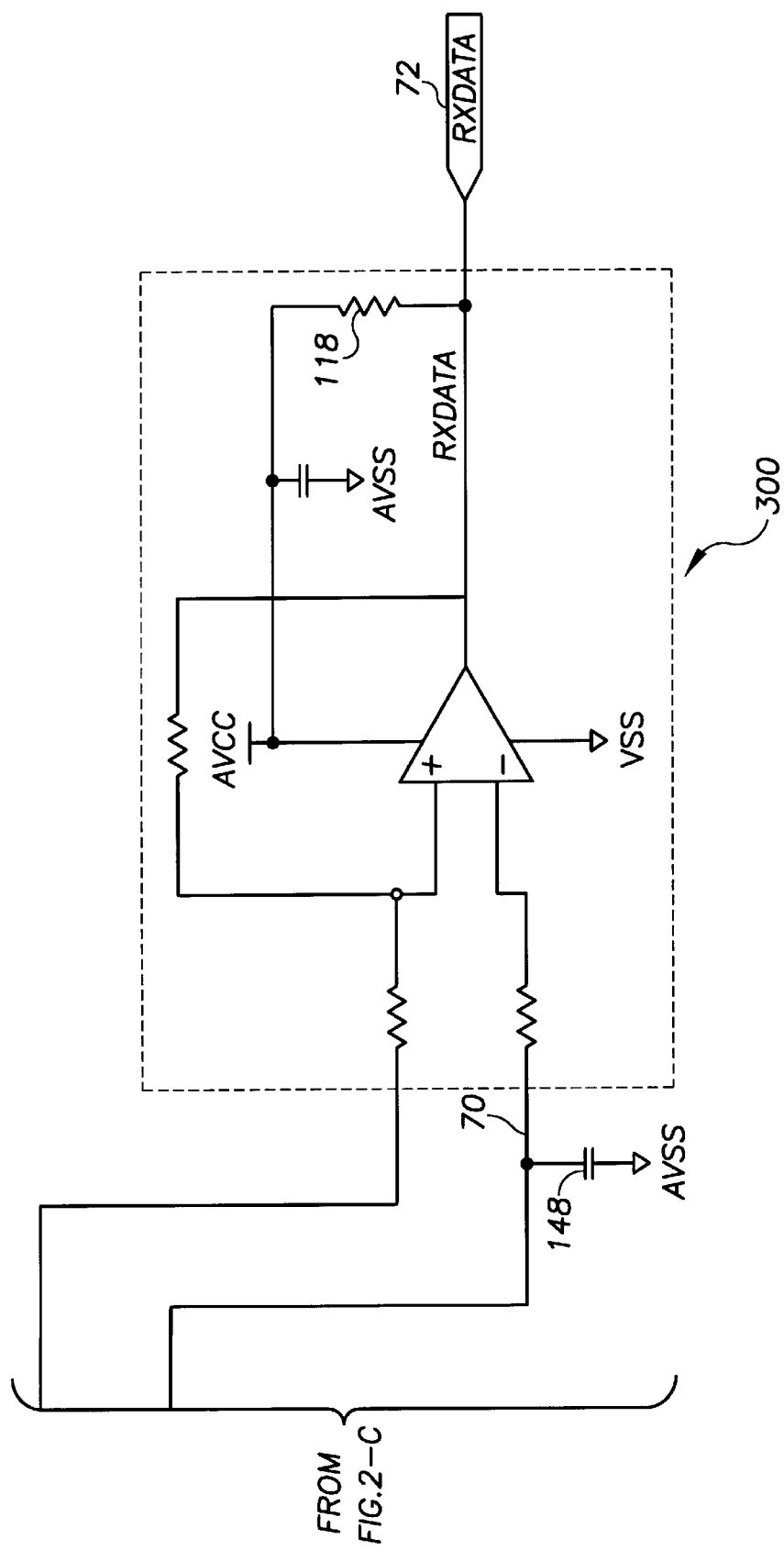
FIG.2-D

– continued

POWER ON/OFF CONTROL CIRCUIT AND METHOD

CROSS-REFERENCE TO RELATED APPLICATION

This application is related to the following U.S. patent application:

| SER. NO. | TITLE | INVENTOR |
|---|---|---|
| 300,416 | Baseband Received Data Recovery Averaging Circuit and Method | Magaña |

The related application is assigned to the assignee of the present invention and is hereby incorporated herein in its entirety by this reference thereto.

This application is related to the following U.S. Patent Application:

| | Application: | |
|---|---|---|
| [SERIAL NO. | TITLE | INVENTOR(S) |
| 07/917,497 | General I/O Port Interrupt Mechanism | Gulick, et al. |
| 07/917,489 | Improved External Memory Access Control for a Processing Unit | Gulick, et al. |
| 07/917,488 | Method of Weak Pull-up Disable and Mechanism Therefor for Use with Microcontroller in Integrated Circuit and Cordless Telephone Using the Integrated Circuit | Bowles, et al. |
| 07/917,503 | Interrupt Mask Disable Circuit and Method | Bowles, et al. |
| 07/918,627 | Integrated Circuit and Cordless Telephone Using the Integrated Circuit | Gulick, et al. |
| 07/918,626 | Modulator Test System | Peterson, et al. |
| 07/918,625 | Keypad Scanner Process and Device and Cordless Telephone Employing the Mechanism | Gulick |
| 07/918,624 | Serial Interface Module and Method | Gulick, et al. |
| 07/918,631 | Low Power Emergency Telephone Mode | Peterson, et al. |
| 07/918,632 | In-Circuit Emulation Capability Mode in Integrated Circuit and Cordless Telephone Using the Integrated Circuit | Gulick, et al. |
| 07/918,622 | Clock Generator Capable of Shut-down Mode and Clock Generation Method | Peterson, et al. |
| 07/918,621 | Signal Averager | Gulick |
| (06940-0099; TTO410) | Power Management Circuit for Use in Digital Cordless Telephones and Like Apparatus | Hendrickson, et al. |
| (06940-0100; TTO411) | Apparatus and Method for Sending Signal Data | Schnizlein, et al. |
| (06940/0101; TTO412) | Burst Synchronization of Time Division Multiplexed Transceiver Pairs | Schnizlein |
| (06940/0102; TTO413) | Receiver Quality Measurement System for Use in Digital Cordless Telephones and Like Apparatus | Hendrickson, et al. |
| 06940/0103; TTO414) | Dual-Mode Baseband Controller for Radio-Frequency Interfaces Relating to Digital Cordless Telephones | Hendrickson, et al. |
| (06940/0104; TTO415) | Method and Apparatus for External Intermediate Data Processing | Mullins, et al. |
| (06940/0105; TTO416) | Programmed Transistor Array | Allee |
| (06940/0106; TTO417) | Input/Output Data Port and Method | Mullins, et al. |
| (06940/0198; TTO418) | Method and Apparatus for Improved Link Establishment and Monitoring in a Communications System | Hendrickson |
| (06940/0106; TTO425) | Metal Programmed Transistor Array] | Allee |
| (06940/0108; TTO471) | Baseband Received Data Recovery Averaging Circuit and Method | Magaña |

This is a continuation of application Ser. No. 08/621,769, filed Mar. 22, 1996, abandoned, which is a continuation of application Ser. No. 08/280,610 filed Aug. 26, 1994, abandoned.

BACKGROUND OF THE INVENTION

1. Field of the Invention

The invention relates to electronic devices and reduction of power consumption thereby and, more particularly, relates to a circuit and method for turning power on and off to conserve power consumed by a device, which circuit and method provide for quick ramp up of the device without significant loss of power conserved or loss of accuracy due to ramp up timing requirements.

2. Description of the Related Art

It is often desirable to provide electronics devices with power saving features. This is particularly the case, for example, in electronics devices powered by batteries. As is known, batteries are drained of power in operation over time. At some point after a period of operation, the batteries' useful life as a power source is exhausted. To increase the useful life of batteries powering electronic devices, then, it may be helpful to employ features in the devices that reduce power consumption and thereby allow for longer periods of operation without replacing or recharging batteries.

One particular problem with known power saving features in electronics devices is that those features often operate by turning off power to the devices when not in use or maintaining the devices in an idle state requiring reduced power. When the devices are not supplied with power or are supplied only with reduced power, the devices may require a quick power up (or "ramp up") which typically consumes large amounts of current and requires time which may not be available. Both response times and battery power required to ramp up the devices for use may be significant.

In particular, digital cordless telephones are an example of devices which must be ready to receive and convey communications on demand. When a battery is employed to power a remote unit of those telephones, the remote unit must typically be maintained with the base unit when not in use, where the battery for powering the remote unit is there recharged. When the remote unit is in use, however, it is not feasible to maintain the remote unit with the base unit because that would prevent the desired mobility of the remote unit away from the base unit. Of course, the cordless telephone is used for communications when the remote unit is located a distance away from the base unit. The remote unit when in use is, therefore, generally powered by batteries which are drained during communications use.

In such digital cordless telephones, telephonic communications signals are received by the base unit via the public telephone lines. The base unit and remote unit communicate the communications signals therebetween as RF signals. In operation, the remote unit receives RF signals transmitted by the base unit, which RF signals correspond to the signals received by the base unit from the public telephone lines connected to the base unit.

The remote unit, in receiving RF signals from the base unit, must be ready to receive those signals when and as transmitted by the base unit. This has required that the remote unit be fully ramped up when in use or that the remote unit have at least portions of the remote unit circuitry capable of receiving communicated RF signals fully ramped up for receipt of the signals.

As is clear, maintaining a device, or portions thereof, fully ramped up may be a significant drain of power, which is particularly significant if power is supplied by batteries, as may be the case with a remote unit of digital cordless telephones. Therefore, turning power off to a device, or portions thereof, at times when the device, or portions, is not being operated may conserve power. Though turning the power off may conserve power in some devices, the benefits of that power conservation may be lost if significant power is required to ramp up the device when operation becomes necessary. Also, many devices, such as the remote unit of digital cordless telephones, may require quick ramp up to accomplish desired functions when time dependency is important. An example of such desired functions when time dependency is important in remote units of digital cordless telephones is receipt by the remote unit of RF signals communicated from the base unit.

When it is necessary to quickly ramp up all or portions of an electronics device, such as RF signal reception features of the remote unit of a digital cordless telephone as described, a significant electrical current is typically required and, even with such current, it becomes difficult to design for desired ramp up timing. The requirement of significant current to ramp up a device is particularly a problem in battery powered devices. This is because obtaining a significant amount of current from a battery power source consumes a large portion of the power available from the battery. Designing for desired ramp up timing is also a significant concern because designs achieving quick ramp up in such circumstances tend to be operationally and functionally complex, if even possible to adequately attain. Thus, it may not be quite so beneficial to attempt to conserve battery power by turning off all or portions of the device to reduce battery consumption if turning on the device requires quick ramp up and significantly drains the battery.

The present invention provides power conservation advantages that may otherwise be lost. As will be appreciated by those skilled in the art, the present invention can provide advantages in many instances in which quick ramp up, with power conservation, is desired. As is clear, the invention is an improvement in the art and technology. Though the background of the invention has been described, in part, with respect to cordless telephone application, the invention has other and varied application as will be hereinafter more fully understood.

SUMMARY OF THE INVENTION

One embodiment of the invention is an apparatus for turning power to a device on and off. The apparatus comprises a first signal input, a second signal input, a first charge output electrically connected with the first signal input, a transistor electrically connected with the second signal input, and a second charge output electrically connected with the transistor, wherein the first charge output, when the first signal input is powered on, electrically ramps up a first portion of the device, a second portion of the device pulling electrically high when the first charge output is powered on electrically ramping up the first portion and wherein the second charge output, when the second signal input is powered on, electrically charges the transistor and the transistor electrically ramps up the second portion of the device, the second portion of the device being pulled low to electrically ramp up the second portion of the device concurrently with the first portion.

In another aspect, the transistor is a pnp transistor and the second charge output is taken from a collector of the transistor.

In yet another aspect, the first signal input and the second signal input are electrically connected by at least one resistor.

Another embodiment of the invention is an apparatus for turning power to a device on and off. The apparatus comprises a first signal input, a first resistor connected to the first signal input, a first npn transistor, a base of the first npn transistor being connected to the first resistor, a second resistor, a collector of the first npn transistor being connected to the second resistor, a third resistor connected to the second resistor, a first pnp transistor, a base of the first pnp transistor being connected to the second resistor and an emitter of the first pnp transistor being connected to the third resistor, and a first charge output taken from a collector of the first pnp transistor, the first charge output being connected to the device.

Yet another embodiment of the invention is an apparatus for turning power to a device on and off. The apparatus comprises a second signal input, a fourth resistor connected to the second signal input, a second npn transistor, a base of the second npn transistor being connected to the fourth resistor, a fifth resistor, a collector of the second npn transistor being connected to the fifth resistor, a second pnp transistor, a base of the second pnp transistor being connected to the fifth resistor, a seventh resistor, a collector of the second pnp transistor being connected to the seventh resistor, a third pnp transistor, an emitter of the second pnp transistor being connected to an emitter of the third pnp transistor, and a second charge output taken from a collector of the third pnp transistor, the second charge output being connected to the device.

In another aspect, the apparatus further comprises a sixth resistor connected to the fifth resistor and the base of the second pnp transistor, an eighth resistor, the emitter of the second pnp transistor and the emitter of the third pnp transistor being connected to the eighth resistor, a fourth pnp transistor, a base of the fourth pnp transistor and a collector of the fourth pnp transistor being connected to a base of the fourth pnp transistor, a ninth resistor connected to an emitter of the fourth pnp transistor, a tenth resistor connected to the collector of the fourth pnp transistor, and a capacitor connected to the collector of the fourth pnp transistor.

In yet another aspect, the apparatus further comprises a first signal input, a first resistor connected to the first signal input, a first npn transistor, a base of the first npn transistor being connected to the first resistor, a second resistor, a collector of the first npn transistor being connected to the second resistor, a third resistor connected to the second resistor, a first pnp transistor, a base of the first pnp transistor being connected to the second resistor and an emitter of the first pnp transistor being connected to the third resistor, and a first charge output taken from a collector of the first pnp transistor, the first charge output connected to the device, wherein the first charge output is also connected to the sixth resistor, the eighth resistor, and the ninth resistor.

Another embodiment of the invention is an off/on mechanism for selectively turning a device off and on. The device includes a first capacitor and a second capacitor, the first capacitor and the second capacitor being electrically connected, the first capacitor when supplied with power pulls power from the second capacitor. The mechanism serves to concurrently power up both the first capacitor and the second capacitor when the mechanism turns the device on. The mechanism comprises first input for supplying power to the mechanism when the device is to be selectively turned on, second input for supplying power to the mechanism when the device is to be selectively turned on, first output connected to the device and supplying power to the first capacitor when power is supplied to the mechanism from the first input and the second input, second output connected to the device and supplying power to the second capacitor when power is supplied to the mechanism from the first input and the second input, and circuitry, connecting each of the first input and the second input to each of the first output and the second output, for causing the power supplied to the second capacitor via the second output to compensate for power pulled from the second capacitor when the first capacitor is supplied with power via the first output, concurrently substantially equally charging the first capacitor and the second capacitor.

In another aspect, the circuitry comprises first resistor connected to the first input, first npn transistor, a base of the first npn transistor being connected to the first resistor, second resistor, a collector of the first npn transistor being connected to the second resistor, third resistor connected to the second resistor, first pnp transistor, a base of the first pnp transistor being connected to the second resistor and an emitter of the first pnp transistor being connected to the third resistor, a collector of the first pnp transistor providing the first output, fourth resistor connected to the second input, second npn transistor, a base of the second npn transistor being connected to the fourth resistor, fifth resistor, a collector of the second npn transistor being connected to the fifth resistor, second pnp transistor, a base of the second pnp transistor being connected to the fifth resistor, seventh resistor, a collector of the second pnp transistor being connected to the seventh resistor, third pnp transistor, an emitter of the second pnp transistor being connected to an emitter of the third pnp transistor, a collector of the third pnp transistor providing the second output, sixth resistor connected to the fifth resistor and the base of the second pnp transistor, eighth resistor, the emitter of the second pnp transistor and the emitter of the third pnp transistor being connected to the eighth resistor, fourth pnp transistor, a base of the fourth pnp transistor and a collector of the fourth pnp transistor being connected to a base of the fourth pnp transistor, ninth resistor connected to an emitter of the fourth pnp transistor, tenth resistor connected to the collector of the fourth pnp transistor, and capacitor connected to the collector of the fourth pnp transistor, wherein the first output is also connected to the sixth resistor, the eighth resistor, and the ninth resistor.

A further embodiment of the invention is a method for turning power to a device on and off. The method comprises the steps of inputting a first signal, inputting a second signal, outputting a first charge, transistorizing the second signal, and outputting a second charge, the second charge being the second signal transistorized, wherein the step of outputting the first charge electrically ramps up a first portion of the device, a second portion of the device being pulled electrically high by the step of outputting the first charge and wherein the steps of inputting the first signal and of inputting the second signal cause the step of transistorizing to transistorize the second signal so that the second portion of the device is electrically ramped up concurrent with the ramp up of the first portion of the device.

In another aspect, the method further comprises the step of resisting the first signal and the second signal.

Even a further embodiment of the invention is a method for selectively turning a device off and on. The device includes a first capacitor and a second capacitor, the first capacitor and the second capacitor being electrically connected, and the first capacitor when supplied with power pulls power from the second capacitor. The method concurrently powers up both the first capacitor and the second capacitor when the method turns the device on. The method comprises the steps of supplying power via a first input when the device is to be selectively turned on, supplying power via a second input when the device is to be selectively turned on, supplying power to the first capacitor via a first output during the steps of supplying power via the first input and supplying power via the second input, supplying power to the second capacitor via a second output during the steps of supplying power via the first input and supplying power via the second input, and charging, concurrently and substantially equally, the first capacitor and the second capacitor.

BRIEF DESCRIPTION OF THE DRAWINGS

For a more complete understanding of the present invention, and for further objects and advantages thereof, reference may now be had to the following detailed description, taken in conjunction with the accompanying drawings, wherein:

FIG. 2 is a schematic of an exemplary application of the embodiment of the present invention of FIG. 1 employed in connection with a baseband received data recovery averaging circuit of related U.S. patent application Ser. No. 08/300416 (06940/0108; TTO471).

DETAILED DESCRIPTION

Figure 1:
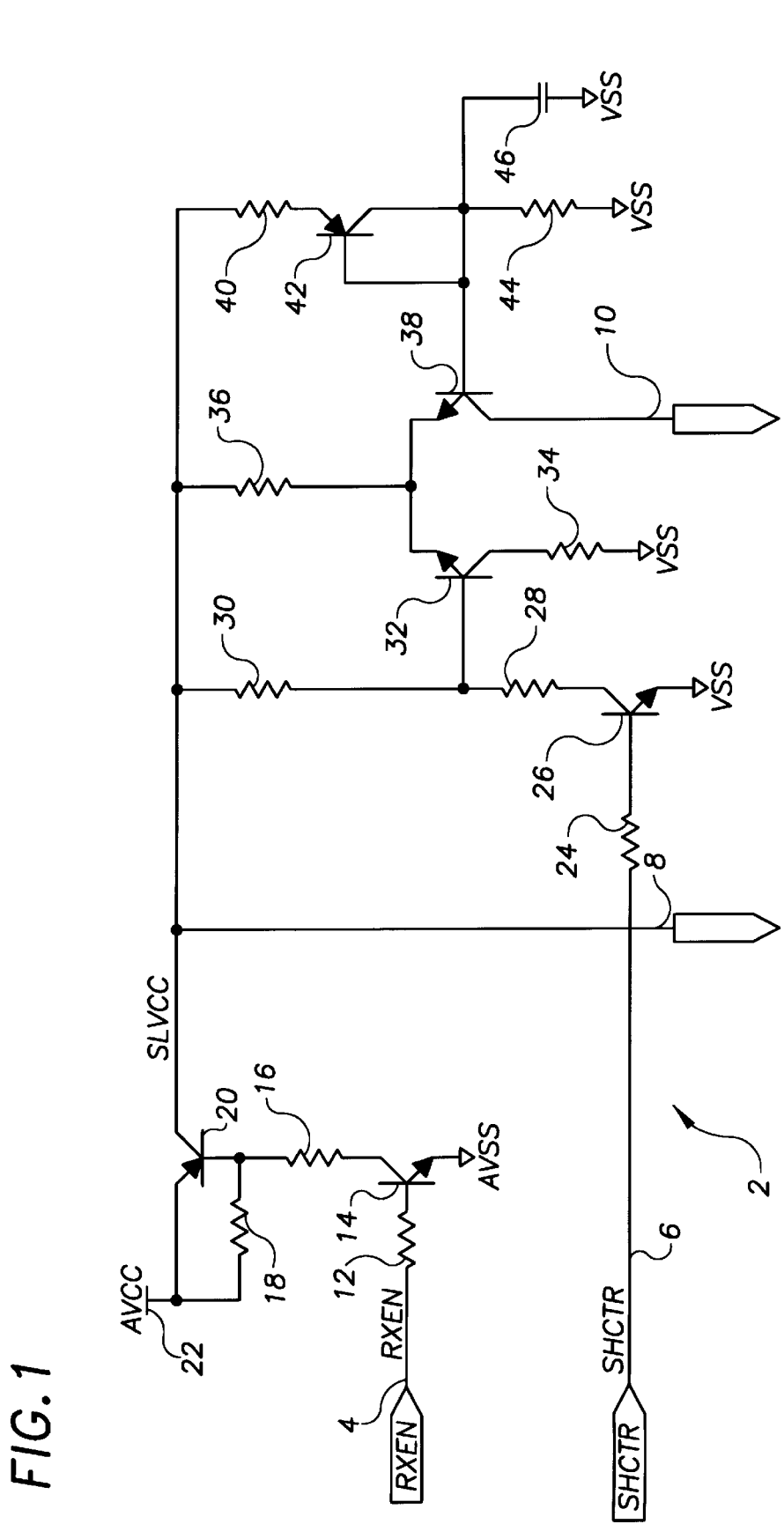
FIG. 1 is a schematic of an embodiment of the power on/off control circuit of the present invention.

In the following detailed description, reference is made to cordless telephones and, in particular, the cordless telephone described in the related applications listed above. Reference is also made to the baseband received data recovery averaging circuit of related U.S. patent application Ser. No. 08/300416 (06940/0108; TTO471). These references are intended for illustrative purposes only and should be considered as exemplary of application of the invention. The invention, nevertheless, has broad application in any instance in which power conservation and, particularly, quick ramp up of circuit elements without significant loss of conserved power, is desired.

Referring first to FIG. 1, an embodiment of the power on/off control circuit 2 of the present invention is shown. The power on/off circuit 2 has dual inputs 4,6. The circuit 2 also has dual outputs 8,10. The inputs 4,6 may be signals generated, for example, by a baseband processor (not shown in FIG. 1). The outputs 8,10 provide ramp up currents, for example, to ramp up dual resistor-capacitor (RC) time constant circuits (not shown in FIG. 1). In this particular embodiment of the circuit 2, the outputs 8,10 provide current to boost capacitors providing a quick ramp up of, for example, the dual RC time constant circuits, as will be hereinafter more fully explained.

Still referring to FIG. 1, input 4 (RXEN) passes to a first resistor 12. The signal across this first resistor 12 is connected with the base of a first npn transistor 14. The emitter of the first npn transistor 14 is connected with ground (AVSS). Although two ground planes AVSS and VSS are shown throughout the figures, this is merely a conventional choice of design, and all future references to either VSS or AVSS will be made by the term "ground". The collector of the first npn transistor 14 is connected with a second resistor 16. The signal across this second resistor 16 connects in parallel to a third resistor 18 and the base of a first pnp transistor 20. Each of the second resistor 18 and the emitter of the first pnp transistor 20 are connected with a first voltage source 22 (AVCC). The collector of the first pnp transistor 20 provides the output 8 (SLVCC) of the circuit 2. As stated, this output 8 serves as a ramp up power supply, for example, to a RC time constant circuit.

Continuing to refer to FIG. 1, input 6 (SHCTR) passes to third resistor 24. The signal across this third resistor 24 is delivered to the base of a second npn transistor 26. The emitter of this second npn transistor 26 is connected to ground, the collector of the second npn transistor 26 is connected to a fourth resistor 28. The signal across this fourth resistor 28 connects with a fifth resistor 30 and to the base of a second pnp transistor 32. Fifth resistor 30 then connects with output 8. The collector of the second pnp transistor 32 is connected to a sixth resistor 34, which sixth resistor 34 is also connected to ground. The emitter of the second pnp transistor 32 is connected with a seventh resistor 36 and serves as the emitter of a third pnp transistor 38. The output 8 is also connected with the seventh resistor 36 and an eighth resistor 40. The signal across the eighth resistor 40 serves as the emitter of a fourth pnp transistor 42. Each of the base and the collector of the fourth pnp transistor 42 is connected with, in parallel, the base of the third pnp transistor 38, a ninth resistor 44, and a capacitor 46. The ninth resistor 44 and the capacitor 46 are each connected to ground. The collector of the third pnp transistor 38 provides the output 10 of the circuit 2. As previously described, this output 10 also serves as a ramp up power supply, for example, to a RC time constant circuit.

Further referring to FIG. 1, operation and advantages of the circuit 2 as a power on/off control mechanism may be understood. When the inputs 4,6 to the circuit 2 are turned off, any elements, such as, for example, capacitors of RC time constant circuits, may become discharged. If such elements thereafter must electrically function, the elements may require a ramp up. That ramp up may require a period of time. The time required and other factors, for example, the particular characteristics of the elements, determine the ramp up required.

Still referring to FIG. 1 and considering operation and advantages of the circuit 2 as a power on/off control mechanism, when the outputs 8,10 of the circuit 2 are employed to ramp up, for example, two differing RC time constant circuits, charging one of such circuits may affect charging of the other circuit, particularly if the two RC time constant circuits are electrically related. An example of such RC time constant circuits is the positive peak detection circuit and the negative peak detection circuit of related U.S. patent application Ser. No. 08/300416 (06940/0108; TT0471), previously mentioned. In that application, each of that positive peak detection circuit and that negative peak detection circuit detect information about the positive and negative peaks, respectively, of a demodulated RF signal and provide a desired RC time constant to the detected peak information. When the present power on/off circuit 2 is employed with those positive and negative peak detection circuits, the present invention circuit 2 allows power to be shut off to the positive and negative peak detection circuits when a demodulated RF signal is not being detected by the positive and negative peak detection circuits. When, however, a demodulated RF signal is received to be detected by the positive and negative peak detection circuits, the present invention circuit 2 provides for quick ramp up of the capacitors (and thus speedy and accurate operation) of the positive peak detection circuit and the negative peak detection circuit.

Further still referring to FIG. 1, this effect of the power on/off circuit 2 in such an exemplary application may be better understood by consideration of the power on-ramp up operations. When the circuit 2 provides power on outputs 8,10 to the positive and negative peak detection circuits, the capacitor of the positive peak detection circuit charges quickly. The capacitor of the negative peak detection circuit would not be charged quickly, however, because the charge on output 10 pulls the negative peak detection circuit positive. Therefore, the circuit 2 provides a charge via output 10 to counteract the pull effect of output 8. This power up via output 10 is a charge from the collector of third pnp transistor 38. The charge from the collector of this third pnp transistor 38 provides sufficient ramp up current for the negative peak detection circuit in the example.

Continuing still to refer to FIG. 1, benefits to power conservation of ramp up via the power on/off circuit 2 can be better understood by comparison of the operation of the circuit 2 with prior operation methods of switching capacitors. As previously mentioned, ramp up of circuit elements, for example, a capacitor of an RC time constant circuit, may require a period of time. In the prior technology, if a quick ramp up was required, for example, so that the circuit would quickly and accurately detect the first peaks of a signal, such as an RF signal received, either power would necessarily be continuously maintained on to the circuit or the circuit allowed for variation of the time constant by logical switching of capacitors. Clearly, continuously maintaining power to the circuit may waste power where the circuit need not be capable of operation during all times. In contrast to maintaining power on to the circuit, the prior technology method of switching capacitors has provided certain advantages of allowing power to the circuit to be turned off when operation is not needed. Such method of capacitor switching can yield a time constant that allows for detection of, for example, the first peaks of a received signal. The method is disadvantageous, however, in that complex designs including switching and logical control of that switching have been necessary in the method.

Still referring to FIG. 1, in the prior methods of switching capacitors to obtain a desired time constant, the time constant circuit has typically included more than one capacitor. That time constant circuit has also included a switching mechanism, for example, a JFET switch, which serves to switch one capacitor out of the circuit and one in, and vice versa. This switching of capacitors has presented particular design and operational problems when the time constant circuit has been intended to provide highly accurate time constants, such as when the time constant circuit is employed in connection with detection of time multiplexed signals in which immediate detection is required on receipt of the signals. One reason for those problems has been that those switches have inherent resistance which may be difficult to accurately compensate for in design and operation.

The time constant circuit has also required logical control of the switching to give the desired time constant. That logical switching has also been complex and difficult to appropriately design and operate in a manner which gives accurate and desired time constant results. Thus, the prior practice of switching capacitors, though it has allowed power conservation because power may be turned off when operation is not necessary and has, in general, provided accurate and quick response operation (such as when a signal is first received), is not a particularly desirable solution.

Next referring to FIGS. 1 and 2, in conjunction, it can, therefore, be understood that the present invention power on/off circuit 2 provides advantages of power conservation without the associated problems previously encountered with switching capacitors. Rather than switching capacitors, the present circuit 2 provides separate outputs 8,10 as input ramp up currents to dual RC time constant circuits 200,202. When the power is input 4,6 to the power on/off circuit 2, the circuit outputs the dual outputs 8,10. Output 8 serves to ramp up one RC time constant circuit 200. Because the RC time constant circuits 200,202 are electrically associated, when output 8 is powered on, thereby ramping up the RC time constant circuit 200, the RC time constant circuit 202 tends to go positive. Therefore, additional ramp up current is required to ramp up RC time constant circuit 202. That additional ramp up current is provided by output 10. The output 10 is a charge taken from the collector of third pnp transistor 38 of the power on/off circuit 2. The charge taken from that collector is applied directly to the capacitor 140 in order to sufficiently and immediately ramp up the capacitor 140. In this manner, quick ramp up of each of the dual RC time constant circuits 200,202 is obtained. Further, ramp up is accomplished to obtain accurate time constants provided by each of the dual circuits 200,202 without capacitor switching in the circuits 200,202. This quick ramp up provided by the power on/off circuit 2 allows for both accurate time constants from the circuits 200,202 and immediate response capability for detection, for example, of first peaks of a received signal (such as an RF signal).

Referring now to FIG. 2, exemplary application of the embodiment of the power on/off circuit 2 of FIG. 1 with dual RC time constant circuits 200,202 is shown. In the example, the dual RC time constant circuits 200,202 are a positive peak detector circuit and a negative peak detector circuit, respectively, for detecting information regarding positive and negative peaks of a signal, such as, for example, a demodulated RF signal. Hereinafter, the terms positive peak detector circuit and negative peak detector circuit may be used to identify the respective RC time constant circuits and with the respective identifying numbers 200,202.

Still referring to FIG. 2, the concepts of the embodiment of the power on/off circuit 2 may be described with reference to application with a positive peak detector circuit 200, a negative peak detector circuit 202, and a slicer circuit 300, which together provide a baseband received data recovery averaging circuit 50 such as that disclosed in related U.S. patent application Ser. No. 08/300416 (06940/0108; TTO471), of the same inventor. Such an averaging circuit 50 may be employed, for example, with a cordless telephone base unit and/or remote unit conforming to the cordless telephone second generation (CT2) standard. In that employment, demodulated RF signals are received by the base unit and/or remote unit as communications therebetween. The CT2 standard specifies time division duplexed transmission and reception of RF signals between base unit and remote unit. Each transmission and reception therefore consists of a burst of data information in the form of RF signals. Such burst transmission by one unit may result in receipt of asymmetrical signals once demodulated at the RF module of the other unit. These asymmetrical signals, when converted to digital signals by the receiving unit, may consist of narrow pulse width pulses which are not necessarily understood by any associated circuitry, for example, that of a baseband processor. Bit errors are, therefore, possible in the devices.

Still referring to FIG. 2, the exemplary circuit 50, with which the power on/off circuit 2 of the present invention may be used, minimizes the possibility of bit errors in devices, such as those shown in the related applications. In the prior technology, "squaring" of an analog signal (such as demodulated RF signals received by a base unit or remote unit of a cordless telephone) to achieve a digital pulse signal has been accomplished by transitioning digital pulses of the digital pulse signal at the instant that the analog wave form of the analog signal transitions about a DC bias point. When the analog signal is asymmetrical, the transitions may yield narrow pulse width pulses. These narrow pulse width pulses may not be detected correctly by a processor operating according to a relatively broader bit period. Thus, bit errors may occur in devices. An averaging circuit 50 (like that described herein in connection with the exemplary application for the present on/off circuit 2 and method), rather than transitioning pulses at the analog signal transitions, tries to maintain a more equivalent difference between peaks and bases the transitioning of pulses on the more equivalent difference. More specifically, such an averaging circuit 50 minimizes how narrow the pulse width of digital pulses may be, thereby optimizing the recovery of data by a baseband processor.

Still referring to FIG. 2, such an averaging circuit 50 tracks the envelope of the positive peaks and negative peaks of an analog waveform 53. This tracking of the envelope provides two waveforms, one characteristic of the envelope of the positive peaks and the other characteristic of the envelope of the negative peaks, respectively. These two waveforms remain somewhere in the middle of the peaks of the analog waveform, and when summed by the circuit 50, yield an analog waveform with transitions of more uniform frequency, yet maintain the transitions necessary for "squaring" by the slicer circuit 300 of the averaging circuit 50. The two waveforms characteristic of the envelope of the positive and negative peaks are generated by the positive peak detector circuit 200 and the negative peak detector circuit 202, respectively. In effect, each of the positive peak detector circuit 200 and the negative peak detector circuit 202 operates by detecting a peak (either positive or negative, as the case may be) and then supplying an RC time constant. The results from the positive peak detector circuit 200 and the negative peak detector circuit 202 are summed, with the result supplied to the slicer circuit 300. In this manner, the wave form of the resulting sum signal supplied to the slicer circuit 300 remains somewhere in the middle about the DC bias point, and extremes of the offset are not reached by the waveform. By so establishing and maintaining a wave form of the resulting sum within the middle of the amplitude extremes, more uniform transition frequencies are maintained, yet relative positive and negative peaks are maintained. "Squared up" digital data signals from the averaging circuit 300 available to an associated processor, then, exhibit more uniform pulse width readable by the processor with respect to the bit period thereof, and so bit errors are reduced.

Further still referring to FIG. 2, the power on/off circuit 2 operates with such a baseband received data recovery averaging circuit 50 in the manner previously generally described with respect to all applications of the circuit 2. That is, inputs 4,6 are supplied to the circuit 2 and outputs 8,10 are provided to ramp up the positive and negative peak detector circuits 200,202 (i.e., RC time constant circuits) of the averaging circuit 50. The ramp up current to the positive peak detector circuit 200 is supplied by output 8 of the power on/off circuit 2. That output 8 connects with a collector of a first npn transistor 120 of the positive peak detector circuit 200 and with a collector of a second npn transistor 142, as well as with several resistors 116,130 of the positive peak detector circuit 200 and a resistor 138 of the negative peak detector circuit 202. The emitter of first npn transistor 120 supplies a resistor 124 and a capacitor 126, in parallel, through a line VPOS, thereby allowing ramp up of the positive peak detector circuit 200.

Continuing to refer to FIG. 2, the ramp up current to the negative peak detector circuit 202 is supplied both by output 8 supplied to the collector of an npn transistor 142 and after crossing a resistor 138 and supplying the emitter of a pnp transistor 136 (each of those transistors connecting with a capacitor 140 through a line VNEQ) and by output 10. Output 10, as previously described, is wired directly to capacitor 140. The charge on output 10 is from the collector of third pnp transistor 38. The charge provides sufficient ramp up current for the suitable operation of the negative peak detection circuit 202 to immediately and accurately detect appropriate negative peak information and yield an appropriate time constant with respect to a demodulated RF signal received.

Even further referring to FIG. 2, as is further described in the related U.S. Patent Applications, sizes of elements of the baseband received data recovery averaging circuit 50 hereinafter stated will be suitable for application of the averaging circuit 50 to the cordless telephone and related devices described in those related applications. In the averaging circuit 50 described in those related applications as suitable therewith, the analog input 52 (RXFILOUT) feeds the slicer circuit 300 and the baseband received data recovery averaging circuit 50 elements. The analog input 52 to the averaging circuit 50 elements first passes to a 0.68 $\mu$F capacitor 110. The capacitor 110 is connected with a first diode 112 and a second diode 114. The first diode connects with a 4.3K resistor 116 supplied by a voltage source $V_{cc}$ 22. The resistor 116 and first diode 112 are connected with the base of a first npn transistor 120, the collector of which is supplied by the voltage source 118 and the emitter of which is connected with a 4.75K resistor 124, a 0.1 $\mu$F capacitor 126, and the base of a first pnp transistor 128. The emitter of the first pnp transistor 128 is connected to a 2.21K resistor 130 and a 4.75K resistor 132. The voltage source 118 supplies resistor 130. The collector of the transistor 128 is connected to ground. The second diode 114 is connected with a 4.3K resistor 134 and the base of a second pnp transistor 136. The transistor 136 has its collector connected to ground and its emitter connects with a 4.75K resistor 138, a 0.1 $\mu$F capacitor 140, and the base of a second npn transistor 142. The resistor 138 is supplied by voltage source 122. The emitter of the transistor 142 is connected with a 2.21K resistor 144 and a 4.75K resistor 146. The signal 55 across resistor 132 and the signal 57 across resistor 146 are summed 68 at the summing point. The summed signal 69 connects with a 4700 pF capacitor 148 and the slicer circuit 300. The slicer circuit 300 yields a digital data signal 72.

Further referring to FIG. 2, given that particular baseband received data recovery averaging circuit 50 having elements of the sizes stated, an embodiment of the power on/off circuit 2 suitable for operation therewith comprises elements sized as hereinafter stated. Inputs 4,10 are signals RXEN and SHCTR from a baseband processor (not shown), such as, for example, the baseband processor described in the related U.S. Patent Applications listed above. The resistors 12,16,18,28,30,34,36,40,44 of the power on/off circuit 2 suitable to the application are sized as follows: first resistor 12 is 8.2K; second resistor 16 is 2.2K; third resistor 18 is 4.7K; fourth resistor 28 is 18K; fifth resistor 30 is 56K; sixth resistor 34 is 0 ohm; seventh resistor 36 is 56 ohm; eighth resistor 40 is 13K; and ninth resistor 44 is 10K. The capacitor 46 of the power on/off circuit 2 for the application may be a 2200 $\mu$F capacitor.

Based upon the foregoing, those skilled in the art will fully understand and appreciate the advantages exhibited by the teachings herein. Those skilled in the art will also understand and appreciate that various alternatives, additions, and modifications may be made in embodiments and, in particular, the preferred embodiment described herein. Further details of related systems, apparatus and methods may be found in the related cases listed in the Cross-Reference to Related Applications section above. Although those related details are not necessary in every case for those skilled in the art to practice the present invention or to comprehend its best mode of practice, those details may be useful to those skilled in the art and reference to them may be desirable. The foregoing detailed description is, thus, to be clearly understood as being given by way of illustration and example only, the spirit and scope of the present invention being limited solely by the appended claims.

What is claimed is:

1. An apparatus for turning power to a device on and off, comprising:

a first signal input;

a second signal input;

a first charge output electrically connected with said first signal input;

a transistor circuit electrically connected with said second signal input; and a second charge output electrically connected with said transistor circuit;

wherein said first charge output, in response to said first signal input being powered on, electrically ramps up a voltage level of a first portion of said device, and a voltage level of a second portion of said device pulls electrically high when said first charge output is powered on to electrically ramp up said voltage level of said first portion; and wherein said second charge output, in response to said second signal input being powered on, causes said transistor circuit to electrically ramp up said voltage level of said second portion, said voltage level of said second portion being pulled to electrically ramp up said voltage level of said second portion concurrently with said voltage level of said first portion although said first portion is diverting a portion of said power from said second portion.

2. An off/on mechanism for selectively applying a power for turning a device off and on, said device including a first capacitor and a second capacitor, said first capacitor and said second capacitor being electrically connected, said mechanism serving to concurrently charge up both said first capacitor and said second capacitor when said mechanism turns said device on, comprising:

first input for supplying said power to said mechanism when said device is to be selectively turned on;

second input for supplying said power to said mechanism when said device is to be selectively turned on;

first output connected to said device and enabling a first portion of said power to charge said first capacitor when said power is supplied to said mechanism responsive to said first input and said second input;

second output connected to said device and enabling a second portion of said power to said second capacitor when said power is supplied to said mechanism responsive to said first input and said second input; and circuitry, connecting each of said first input and said second input to each of said first output and said second output, for causing said first capacitor when supplied with said first portion of said power to divert a third portion of said power from said second capacitor, and for causing said second portion of said power to be supplied to said second capacitor via said second output to compensate for said third portion of said power diverted from said second capacitor when said first capacitor is supplied with power via said first output, concurrently and selectively charging said first capacitor and said second capacitor.

3. A method for turning power to a device on and off, comprising the steps of:

inputting a first signal;

inputting a second signal;

outputting a first charge;

amplifying said second signal; and outputting a second charge, said second charge being said second signal amplified;

wherein said step of outputting said first charge electrically ramps up a voltage level of a first portion of said device, a voltage level of a second portion of said device being pulled electrically high by said step of outputting said first charge; and wherein said steps of inputting said first signal and of inputting said second signal cause said step of amplifying to amplify said second signal so that said voltage level of said second portion is electrically ramped up concurrent with said ramp up of said voltage level of said first portion.

4. A method for selectively applying a power to turn a device off and on, said device including a first capacitor and a second capacitor, said first capacitor and said second capacitor being electrically connected, said method concurrently charges both said first capacitor and said second capacitor when said method turns said device on, comprising the steps of:

enabling supply of said power via a first input when said device is to be selectively turned on;

enabling supply of said power via a second input when said device is to be selectively turned on;

supplying a first portion of said power to said first capacitor via a first output;

supplying a second portion of said power to said second capacitor via said second input;

supplying a third portion of said power to said second capacitor via a second output during said steps of supplying said first portion of said power via said first input and supplying said second portion of said power via said second input; and charging, concurrently and selectively, said first capacitor and said second capacitor, wherein said first capacitor, when supplied with said first portion of said power, diverts said second portion of said power from said second capacitor.

5. An apparatus for turning power to a device on and off, comprising:

a first signal input;

a second signal input;

a first charge output electrically connected with said first signal input;

a transistor electrically connected with said second signal input; and a second charge output electrically connected with said transistor;

wherein said first charge output, when said first signal input is activated, electrically ramps up a voltage level of a first portion of said device, wherein a voltage level of a second portion of said device pulls electrically high in response to said first charge output being activated, thereby electrically ramping up said voltage level of said first portion;

wherein said second charge output, when said second signal input is activated, electrically enables said transistor and said transistor electrically ramps up said voltage level of said second portion, said voltage level of said second portion being pulled to electrically ramp up said voltage level of said second portion although said first portion is diverting a portion of said power from said second portion; and wherein said transistor is a pnp transistor and said second charge output is taken from a collector of said transistor.

6. An apparatus for turning power to a device on and off, comprising:

a signal input;

a first resistor connected to said signal input;

an npn transistor, a base of said npn transistor being connected to said first resistor;

a second resistor, a collector of said npn transistor being connected to said second resistor;

a first pnp transistor, a base of said first pnp transistor being connected to said second resistor;

a third resistor, an emitter of said first pnp transistor being connected to said third resistor;

a second pnp transistor, a collector of said first pnp transistor being connected to a collector of said second pnp transistor;

a first charge output taken from an emitter of said second pnp transistor, said first charge output being connected to said device;

a fourth resistor connected to said second resistor and said base of said first pnp transistor;

a fifth resistor, said collector of first pnp transistor and said collector of said second pnp transistor being connected to said fifth resistor;

a third pnp transistor, a base of said third pnp transistor and an emitter of said third pnp transistor being connected to a base of said second pnp transistor;

a sixth resistor connected to a collector of said third pnp transistor;

a seventh resistor connected to said emitter of said third pnp transistor; and a capacitor connected to said emitter of said third pnp transistor.

7. An on/off mechanism for selectively turning a device off and on, said device including a first capacitor and a second capacitor, said first capacitor and said second capacitor being electrically connected, said first capacitor when supplied with power diverts power from said second capacitor, said mechanism serving to concurrently charge both said first capacitor and said second capacitor when said mechanism turns said device on, comprising:

first input for supplying power to said mechanism when said device is to be selectively turned on;

second input for supplying power to said mechanism when said device is to be selectively turned on;

first output connected to said device and enabling supply of power to said first capacitor when power is supplied to said mechanism from said first input and said second input;

second output connected to said device and enabling supply of power to said second capacitor when power is supplied to said mechanism from said first input and said second input;

circuitry, connecting each of said first input and said second input to each of said first output and said second output, for causing said power supplied to said second capacitor via said second output to compensate for power diverted from said second capacitor when said first capacitor is supplied with power via said first output, concurrently and selectively charging said first capacitor and said second capacitor;

first resistor connected to said first input;

first npn transistor, a base of said first npn transistor being connected to said first resistor;

second resistor, a collector of said first npn transistor being connected to said second resistor;

third resistor connected to said second resistor;

first pnp transistor, a base of said first pnp transistor being connected to said second resistor and a collector of said first pnp transistor being connected to said third resistor, an emitter of said first pnp transistor providing said first output;

fourth resistor connected to said second input;

second npn transistor, a base of said second npn transistor being connected to said fourth resistor;

fifth resistor, a collector of said second npn transistor being connected to said fifth resistor;

second pnp transistor, a base of said second pnp transistor being connected to said fifth resistor;

sixth resistor, an emitter of said second pnp transistor being connected to said seventh resistor;

third pnp transistor, a collector of said second pnp transistor being connected to a collector of said third pnp transistor, an emitter of said third pnp transistor providing said second output;

seventh resistor connected to said fifth resistor and said base of said second pnp transistor;

eighth resistor, said collector of said second pnp transistor and said collector of said third pnp transistor being connected to said eighth resistor;

fourth pnp transistor, a base of said fourth pnp transistor and an emitter of said fourth pnp transistor being connected to a base of said third pnp transistor;

ninth resistor connected to a collector of said fourth pnp transistor;

tenth resistor connected to said emitter of said fourth pnp transistor; and third capacitor connected to said emitter of said fourth pnp transistor.

* * * * *

UNITED STATES PATENT AND TRADEMARK OFFICE
CERTIFICATE OF CORRECTION

PATENT NO. : 6,104,217
DATED : August 15, 2000
INVENTOR(S) : Magana

It is certified that error appears in the above-identified patent and that said Letters Patent is hereby corrected as shown below:

Column 1,
Line 20, should be deleted.

Column 2,
Line 15, should be deleted.
Line 19, "Aug." should read -- July --.

Column 12,
Lines 20-22, please delete the sentence beginning with "Further details" and ending at "section above.".

Signed and Sealed this

Seventh Day of May, 2002

Attest:

JAMES E. ROGAN
*Attesting Officer*   *Director of the United States Patent and Trademark Office*

UNITED STATES PATENT AND TRADEMARK OFFICE
CERTIFICATE OF CORRECTION

PATENT NO.    : 6,104,217
DATED         : August 15, 2000
INVENTOR(S)   : Magana It is certified that error appears in the above-identified patent and that said Letters Patent is hereby corrected as shown below:

<u>Column 1, line 20 through Column 2, line 15,</u>
Should be deleted.

<u>Column 2,</u>
Line 19, "Aug." should read -- July --.

<u>Column 12,</u>
Lines 20-22, please delete the sentence beginning with "Further details" and ending at "section above.".

This certificate supersedes Certificate of Correction issued on May 7, 2002.

Signed and Sealed this

Twenty-fourth Day of December, 2002

JAMES E. ROGAN
*Director of the United States Patent and Trademark Office*